(12) United States Patent
MacArthur et al.

(10) Patent No.: US 11,104,310 B2
(45) Date of Patent: Aug. 31, 2021

(54) SYSTEMS AND METHOD FOR VERIFYING VEHICLE PEDAL ASSEMBLY

(71) Applicant: Honda Motor Co., Ltd., Tokyo (JP)

(72) Inventors: Benjamin B. MacArthur, Barrie (CA); Michael A. Routly, Barrie (CA); Karan Guglani, Mississauga (CA)

(73) Assignee: HONDA MOTOR CO., LTD., Tokyo (JP)

( * ) Notice: Subject to any disclaimer, the term of this patent is extended or adjusted under 35 U.S.C. 154(b) by 541 days.

(21) Appl. No.: 16/140,775

(22) Filed: Sep. 25, 2018

(65) Prior Publication Data

US 2020/0094793 A1    Mar. 26, 2020

(51) Int. Cl.
| B60T 7/06 | (2006.01) |
|---|---|
| G01R 31/54 | (2020.01) |
| B60R 21/09 | (2006.01) |
| B60K 26/02 | (2006.01) |
| G01M 99/00 | (2011.01) |
| F16B 21/12 | (2006.01) |

(52) U.S. Cl.
CPC ............. *B60T 7/06* (2013.01); *B60K 26/021* (2013.01); *B60R 21/09* (2013.01); *G01M 99/005* (2013.01); *G01R 31/54* (2020.01); *F16B 21/12* (2013.01)

(58) Field of Classification Search
CPC .......... B60T 7/06; G01R 31/54; G01M 13/00; G01M 99/005; F16B 21/12
See application file for complete search history.

(56) References Cited

U.S. PATENT DOCUMENTS

| 4,383,442 | A | | 5/1983 | Naito | |
|---|---|---|---|---|---|
| 4,883,037 | A | * | 11/1989 | Mabee | .................... F02D 11/10 |
| | | | | | 123/399 |
| 8,578,793 | B2 | | 11/2013 | Carlin | |
| 9,499,138 | B2 | | 11/2016 | Takeshima et al. | |
| 9,513,154 | B2 | | 12/2016 | Futamura et al. | |
| 2004/0042874 | A1 | * | 3/2004 | Benedetti | ................. G05G 1/46 |
| | | | | | 411/377 |
| 2017/0317490 | A1 | * | 11/2017 | Penny | .................. H02H 11/003 |

FOREIGN PATENT DOCUMENTS

CN           104567766 A        4/2015

\* cited by examiner

*Primary Examiner* — Christopher E Mahoney
(74) *Attorney, Agent, or Firm* — Armstrong Teasdale LLP

(57) ABSTRACT

A method and a system for verifying installation of a pedal assembly in a vehicle is provided. The method includes coupling a testing device against the pedal assembly being tested, verifying a position of the testing device relative to the pedal assembly; and positioning a first portion of the testing device against a first side of a pin installed in the pedal assembly. The method also includes verifying the installation of the pin, positioning a second portion of the testing device against a second side of the pin, and verifying the proper installation of the pin.

20 Claims, 5 Drawing Sheets

SYSTEMS AND METHOD FOR VERIFYING VEHICLE PEDAL ASSEMBLY

BACKGROUND OF THE INVENTION

The field of the invention relates generally to pedal assemblies used with vehicles and, more specifically, systems and methods for use in verifying vehicle pedal assembly.

At least some known vehicles use pedal assemblies to enable various operator functions to be performed. For example, known vehicles may include gas pedal assemblies, brake pedal assemblies, and/or clutch pedal assemblies. Known pedal assemblies are generally assembled from multiple components coupled together to create the pedal assembly. For example, in at least some pedal assemblies, a pedal pad is coupled to a pedal arm that is coupled to a push rod or a cable activated by the user applying or removing pressure on or from the pedal pad.

At least some known pedal assemblies use at least one pin to couple components together that pivot or move relative to one another. For example, at least some known pedal assemblies use at least one split pin to ensure a first component is maintained in position relative to a second component within the pedal assembly. For example, in at least some known pedal assemblies, a cotter pin is used to ensure a clevis pin remains coupled within the pedal assembly such that a pedal arm may be moved relative to a push rod.

Because of the relative location of the assembled pedal within the vehicle, verifying the installation of the pedal assembly may be difficult and/or time-consuming. As a result, methods and systems are needed for accurately and easily verifying the installation of a pedal assembly.

BRIEF DESCRIPTION OF THE INVENTION

In one aspect, a method for verifying installation of a pedal assembly in a vehicle is provided. The method includes coupling a testing device against the pedal assembly being tested, verifying a position of the testing device relative to the pedal assembly; and positioning a first portion of the testing device against a first side of a pin installed in the pedal assembly. The method also includes verifying the installation of the pin, positioning a second portion of the testing device against a second side of the pin, and verifying the installation of the pin.

In another aspect, an apparatus for verifying installation of a pedal assembly in a vehicle is provided. The apparatus is configured to couple to the pedal assembly. The apparatus includes at least one guide, a first contact, and a second contact. The guide is configured to maintain a position of the apparatus relative to a pin coupled to the pedal assembly. The first sensor is configured to verify the installation of the pin in the pedal assembly, and the second sensor is configured to verify alignment of the pin in the pedal assembly.

In a further aspect, a system for verifying installation of a pedal assembly in a vehicle is provided. The system includes a testing device, a handle, and at least one detector. The testing device is configured to couple to the pedal assembly. The testing device includes a handle to enable the testing device to be positioned adjacent to the pedal assembly being tested, and at least one sensor for verifying a position of the testing device relative to the pedal assembly. The detector is for verifying installation of the pin within the pedal assembly.

DETAILED DESCRIPTION OF THE INVENTION

Embodiments of the present disclosure relate to testing devices or jigs used to verify the installation of vehicle pedal assemblies positioned within the interior passenger compartment (not shown) of a vehicle. For examples, in some embodiments, the testing device is used to verify the installation of a brake pedal assembly that is positioned within a vehicle to enable an operator to control the braking operation of the vehicle. The embodiments described herein are exemplary and are not limited to the descriptions provided. For example, although described in conjunction with a brake pedal assembly, the testing device described herein may be used to verify the installation of any other pedal assembly, such as, but not limited to a clutch pedal assembly.

Figure 1:
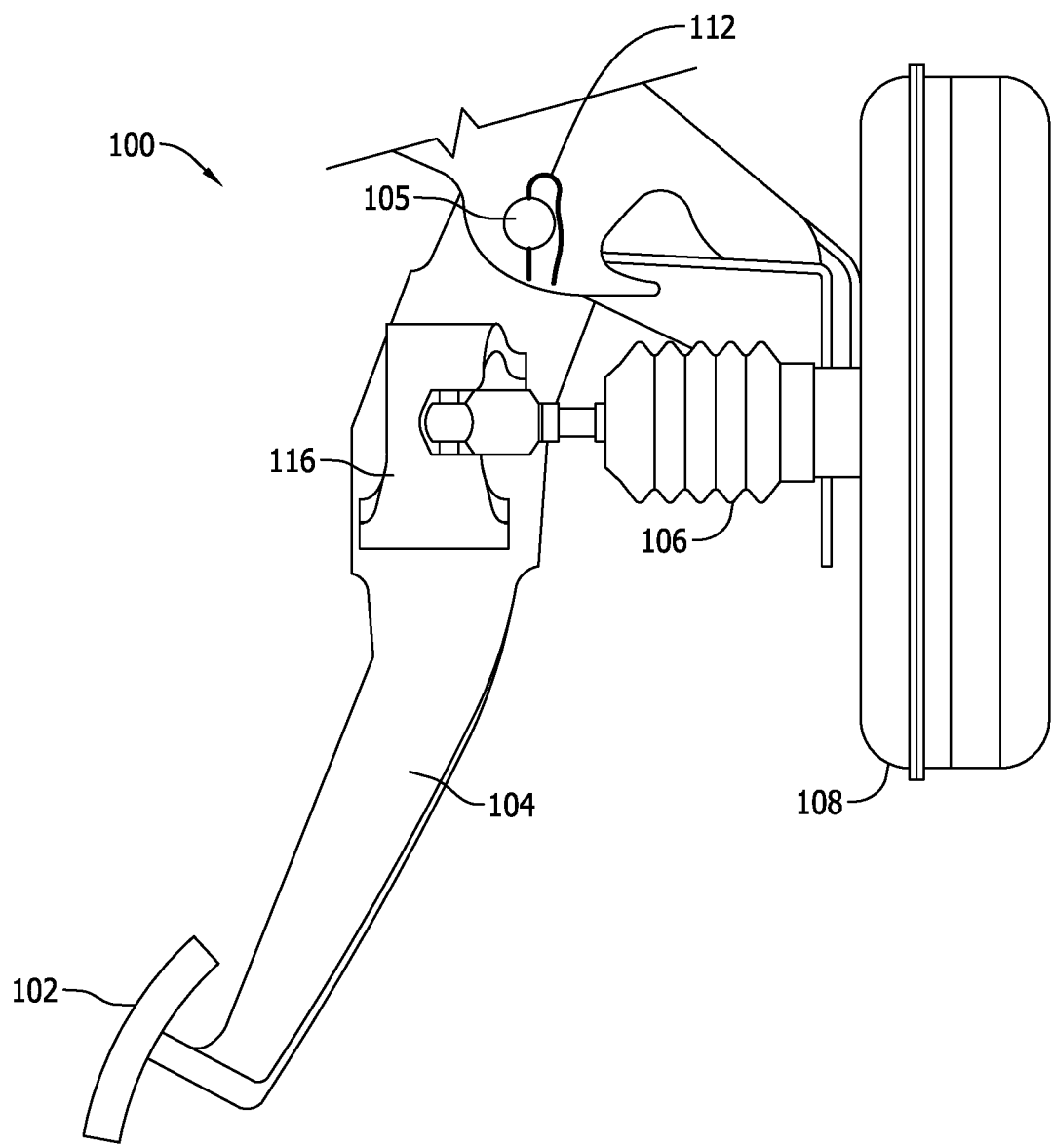
FIG. 1 is an side schematic view of an exemplary brake pedal assembly.

FIG. 1 is a side view of an exemplary pedal assembly 100 that may be used in a vehicle (not shown). More specifically, in the exemplary embodiment, pedal assembly 100 is a brake pedal assembly 100 positioned within an interior passenger compartment (not shown) of the vehicle to enable an operator of the vehicle to control the braking operation of the vehicle. In the exemplary embodiment, pedal assembly 100 includes a pedal pad 102 that is coupled to a pedal arm 104. Pedal arm 104 is pivotally coupled at a pivot shaft 105 via a bracket 106. A cotter pin 112 ensures that pedal arm 104 remains pivotally coupled to bracket 106 via shaft 105. In the exemplary embodiment, cotter pin 112 is fabricated from an electrically-conductive material, such as, but not limited to a ferrous material. Cotter pin 112 facilitates ensuring that pedal arm 104 remains pivotally coupled to bracket 106 via shaft 105. Pedal arm 104 is also coupled via a bracket 120 to a push rod 114 extending from a brake master cylinder 118.

Figure 2:
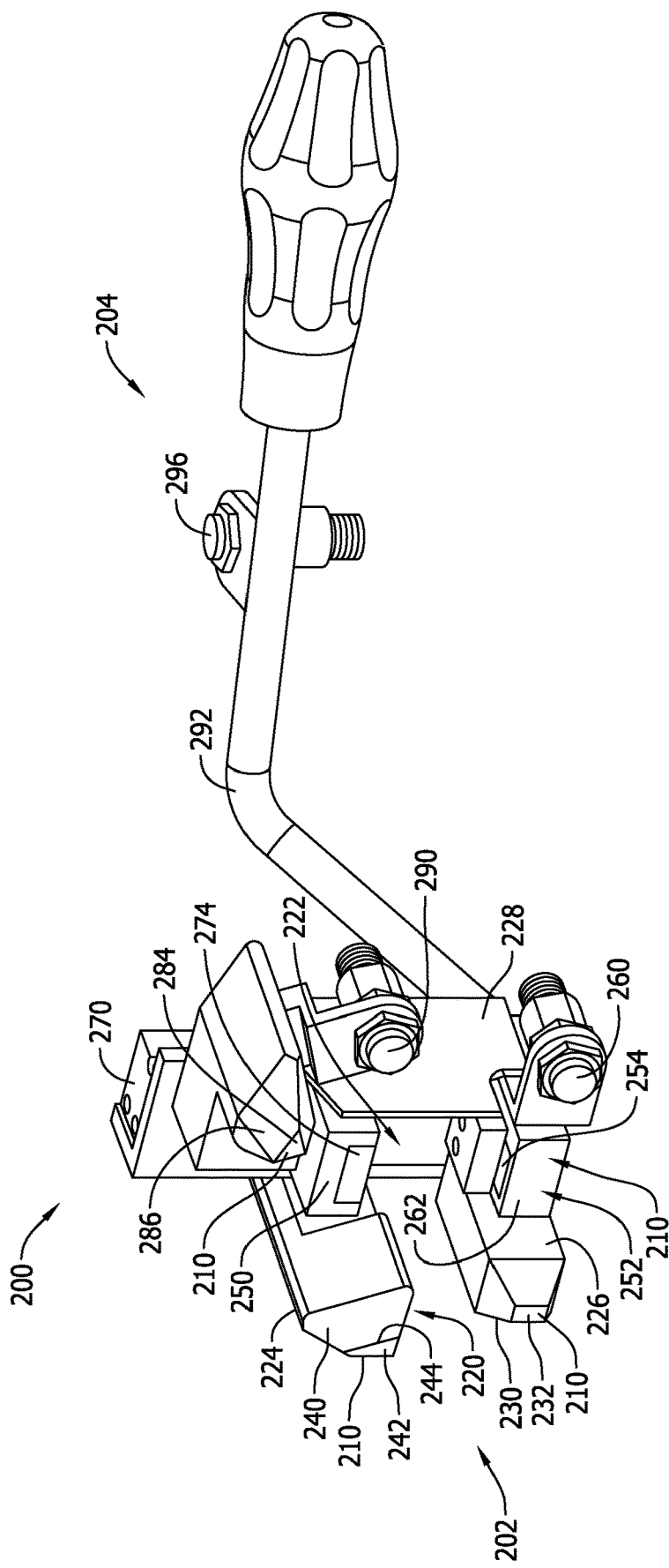
FIG. 2 is a first perspective view of an exemplary testing device that may be used to verify the installation of the pedal assembly shown in FIG. 1 in a vehicle.
Figure 3:
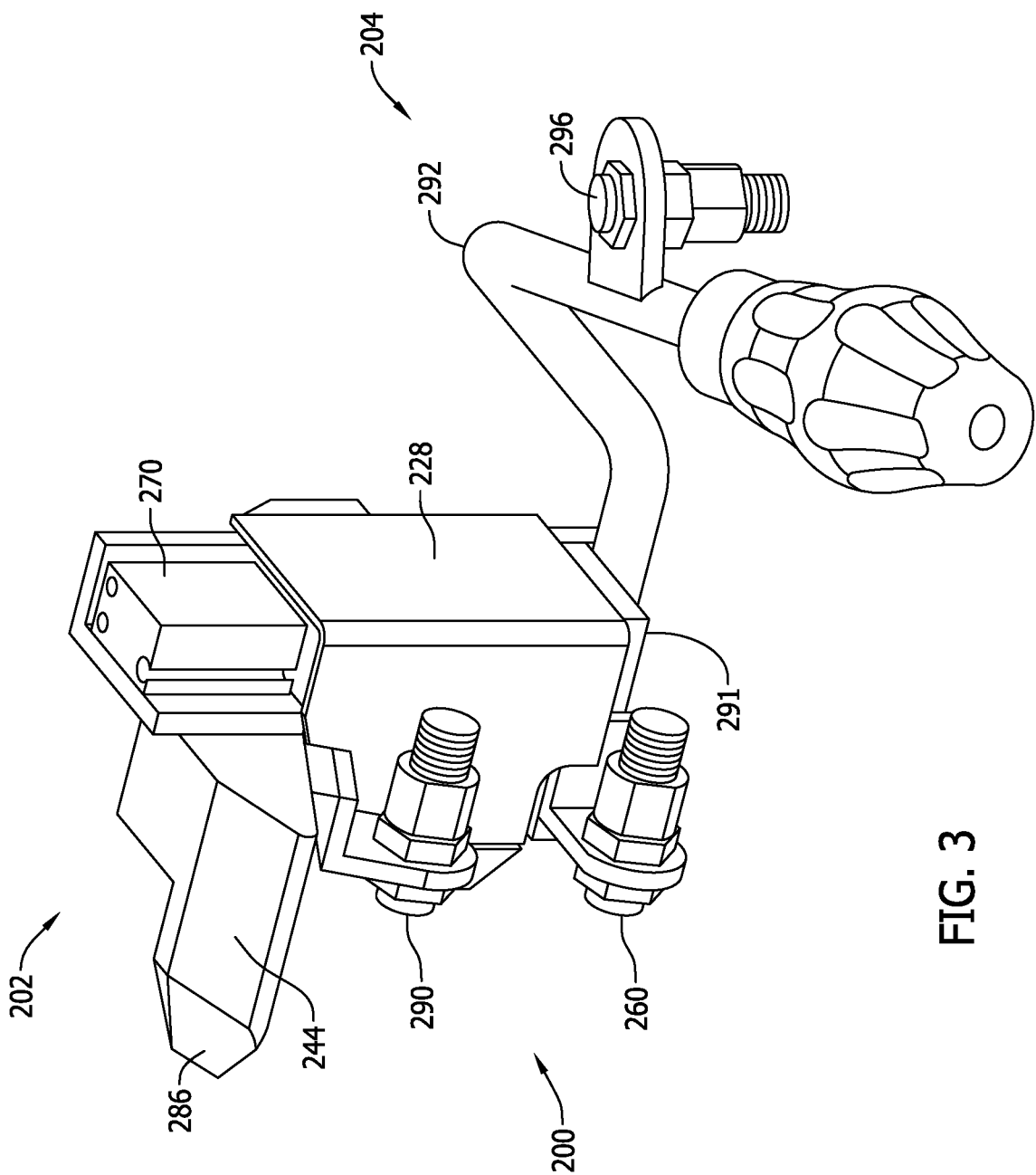
FIG. 3 is a second perspective view of the testing device shown in FIG. 2.
Figure 4:
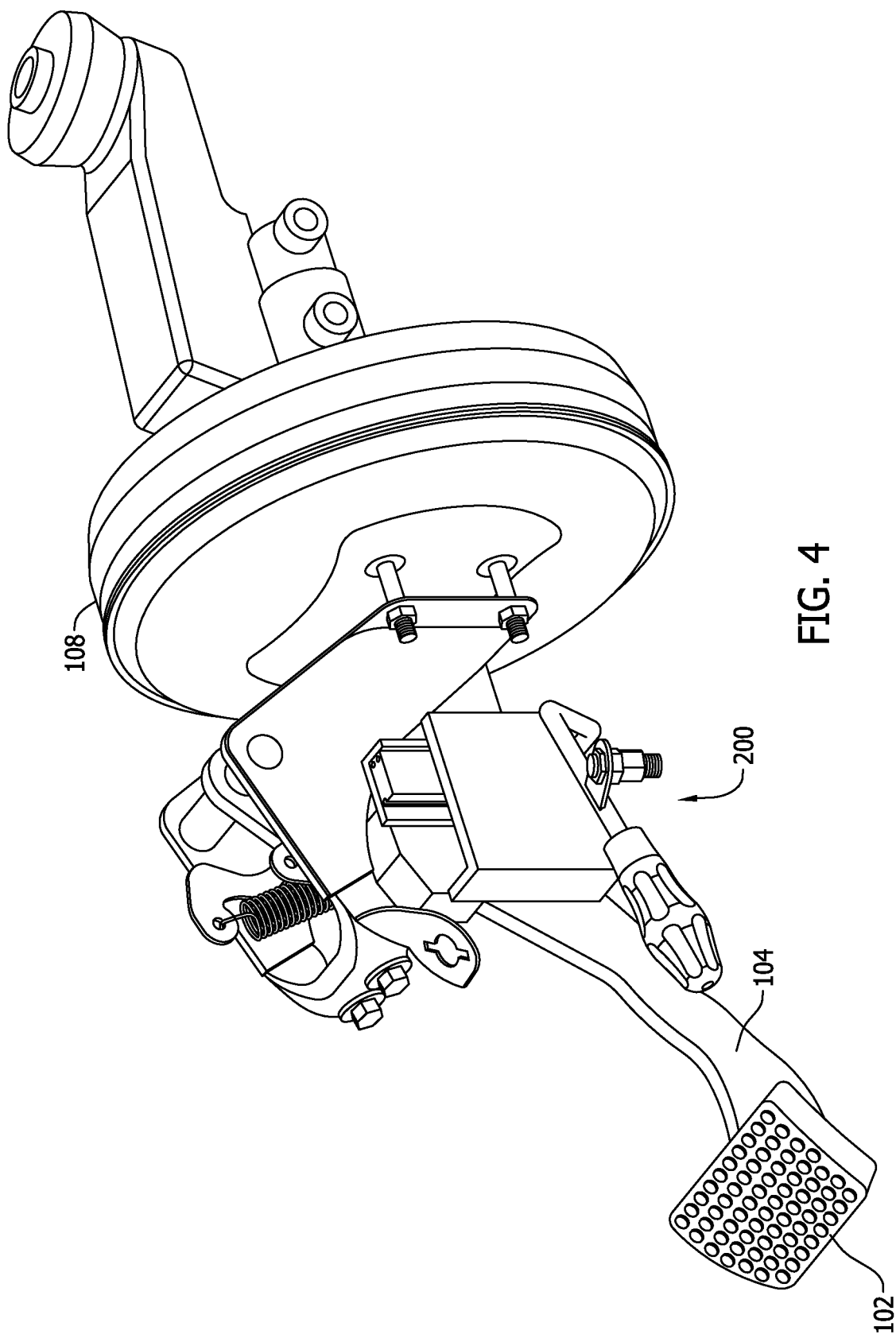
FIG. 4 is perspective view of the testing device shown in FIG. 2 coupled in position for testing a pedal assembly, such as the pedal assembly shown in FIG. 1.

FIG. 2 is a first perspective view of an exemplary testing device 200 that may be used to verify the installation of a pedal assembly in a vehicle, such as pedal assembly 100. FIG. 3 is a second perspective view of testing device 200, and FIG. 4 is perspective view of testing device 200 coupled in position for testing a pedal assembly, such as pedal assembly 100. Although described in conjunction with a motor vehicle brake pedal assembly 100, testing device 200 may be used to verify the installation of any other pedal assembly, such as, but not limited to a clutch pedal assembly. Moreover, in other embodiments, testing device 200 may be used to verify the installation of pedal assemblies used with other vehicles that use pedal assemblies, such as riding mowers, and/or motorcycles, for example.

In the exemplary embodiment, testing device 200 is a part of a testing system in which device 200 includes a jig 202 and a handle 204 coupled to jig 202. Jig 202 is designed to substantially mate against a portion of a pedal assembly 100 being tested. Specifically, in the exemplary embodiment, jig 202 includes a plurality of detent surfaces 210 that are sized, shaped, and oriented to be received in openings (not shown) defined within the pedal assembly. More specifically, in the exemplary embodiment, jig 202 includes four detent surfaces 210. As described in more detail below, in the exemplary embodiment, jig 202, and more specifically, testing device 200, cannot be verified as being in proper position to enable a testing procedure to be performed unless each detent surface 210 is determined to be in a respective opening defined within the pedal assembly.

Detent surfaces 210 ensure that testing device 200 is coupled against the pedal assembly being tested in a proper position relative to the pedal assembly to ensure accuracy in testing the installation of the pedal assembly. As such, testing is repeatable and accurate from vehicle to vehicle. In addition, and as described in more detail below, in the exemplary embodiment, testing device 200 is not operable to perform a pedal assembly installation test unless testing device 200 is verified to be in proper position relative to the pedal assembly being tested. For example, in one embodiment, detent surfaces 210 are coupled to sensors 260 and 280 to ensure that testing device 200 is properly positioned relative to the pedal assembly prior to any installation testing being performed. In the exemplary embodiment, testing device 200 includes four detent surfaces 210. In other embodiments, testing device 200 can include more or less than four detent surfaces 210.

In the exemplary embodiment, jig 202 includes a guide portion 220 and a cotter pin verification portion 222. Guide portion 220 includes an upper guide 224 and a lower guide 226 and are each coupled to a support frame assembly 228. More specifically, in the exemplary embodiment, lower guide 226 is fixedly secured in position to frame assembly 228 and includes a tapered portion 230 that is shaped to be received in a first opening (not shown) defined within the pedal assembly 100 being tested. A lower guide detent surface 232 is formed on tapered portion 230. In the exemplary embodiment, tapered portion 230 is shaped generally like a right frustum and surface 232 is generally rectangular. Alternatively, lower guide 226 and/or surface 232 may have any other shape or orientation that enables test device 200 to function as described herein.

Moreover, in the exemplary embodiment, upper guide 224 also includes a tapered portion 240 that is shaped to be received in a second opening (not shown) defined within the pedal assembly 100 being tested. An upper guide detent surface 242 is formed on tapered portion 240. In the exemplary embodiment, tapered portion 240 is defined by four sides 244 coupled together such that surface 242 is shaped generally as an irregular quadrilateral. Alternatively, upper guide 224 and/or surface 242 may have any other shape or orientation that enables test device 200 to function as described herein.

Cotter pin verification portion 222 includes an upper member 250 and a lower member 252. Lower member 252 is fixedly secured to support frame assembly 228 and includes an installation sensor or contact plate 254 mounted thereto that is sized and oriented to receive a lower portion of a cotter pin, such as pin 112 (shown in FIG. 1) therein. More specifically, as described in more detail herein, sensor 254 enables testing device 200 to initially determine if a cotter pin 112 is installed within the pedal assembly being tested. In addition, sensor 254 also enables testing device 200 to determine if a pin 112 installed in pedal assembly 100 is installed at an incorrect rotational orientation, i.e., 90° from the correct installation orientation, and/or if a pin 112 is installed upside down in the pedal assembly 100. More specifically, if a pin 112 is not installed, is installed upside down, or is installed at an incorrect orientation, the pin 112 will not be detected and the pedal assembly installation test will not proceed.

In the exemplary embodiment, installation sensor 254 is fabricated from an electrically-conductive material, such as, but not limited to, a ferrous metallic material. More specifically, in the exemplary embodiment, sensor 254 is fabricated from the same material used to fabricate cotter pin 112. Alternatively, any electrically-conductive material that enables testing device 200 to function as described herein may be used. Sensor 254 is electrically coupled to a programmable logic controller (PLC) remote from testing device 200.

A lower frame detent surface 262 is defined between lower guide 226 and a proximity sensor 260. Lower frame detent surface 262 is sized, shaped, and oriented to be received within a third opening defined within pedal assembly 100. In the exemplary embodiment, surface 262 is rectangular shaped. Alternatively, surface 262 may have any other shape or orientation that enables testing device 200 to function as described herein.

Cotter pin verification upper member 250 is coupled to a telescoping cylinder 270 that selectively positions upper member 250 relative to testing device 200 and pedal assembly 100. Upper member 250 includes a verification sensor or contact plate 274 mounted thereto that is sized and oriented to receive only an upper portion of a cotter pin 112 therein. Telescoping cylinder 270 selectively moves verification sensor 274 towards a cotter pin 112 installed in pedal assembly 100 during testing. Movement of cylinder 270 enables sensors 254 and 274 to cooperate to verify if a pin 112 is installed in pedal assembly 100, and if a pin 112 installed in pedal assembly 100 is installed at the correct rotational orientation relative to pedal assembly 100, and/or if the pin 112 has been installed upside down.

More specifically, if a pin 112 is installed correctly, a signal will be transmitted to the PLC to verify the correct installation of the cotter pin 112 within the pedal assembly 100 being tested. In the exemplary embodiment, when cotter pin 112 contacts sensors 254 and 274, an electrical circuit is completed and a 5 vdc signal is transmitted to the PLC to verify the pin 112 is installed correctly in the pedal assembly being tested. In some embodiments, in addition to, or in the alternative to, a signal being transmitted to the PLC, completion of the electrical circuit sounds an audible alarm to indicate that the pin 112 is installed correctly in the pedal assembly 100, Accordingly, sensor 274 is fabricated from an electrically-conductive material, such as, but not limited to, a ferrous metallic material. Sensor 274 is also electrically coupled to the PLC. In alternative embodiments, sensor 264 may be coupled to a telescoping member in addition to, or in the alternative to, sensor 274 being coupled to a telescoping cylinder 270.

An upper frame detent surface 284 is formed on a tapered portion 286 formed above upper member 250. Upper frame detent surface 284 is sized, shaped, and oriented to be received within a fourth opening defined within pedal assembly 100. More specifically, in the exemplary embodiment, surface 284 is triangular shaped. Alternatively, surface 284 may have any other shape or orientation that enables testing device 200 to function as described herein.

A pair of proximity sensors 260 and 290 are coupled to frame assembly 228. Specifically, sensor 290 is coupled between detent surface 284 and sensor 260. Sensors 260 and 290 cooperate to verify if testing device 200 is correctly positioned relative to pedal assembly 100. More specifically, and as described in more detail below, sensors 260 and 290 determine if detent surfaces 232, 242, 262, and 284 are each received in their respective openings defined in pedal assembly 100, The testing procedure will not proceed unless sensors 260 and 290 determine that testing device 200 is properly positioned relative to pedal assembly 100.

In the exemplary embodiment, handle 204 is ergonomically-shaped and extends outward from a bottom 291 of frame assembly 228. More specifically, in the exemplary embodiment, handle 204 includes a 90° elbow 292 formed therein that enables an operator to easily position testing device 200 relative to a pedal assembly being tested. In other embodiments, testing device 200 may include any other number of handles or grips that enable an operator to use testing device 200 as described herein. Moreover, alternatively, handle 204 may have any other orientation or extend from any other relative location from frame assembly 228 that enables testing device 200 to function as described herein.

Handle 204 includes an activation button 296 coupled thereto. Depressing activation button 296 enables a testing procedure to begin if testing device 200 is detected as being in the proper position relative to the pedal assembly being tested. An operator performing a testing procedure depresses button 296 to begin the testing procedure described herein.

Figure 5:
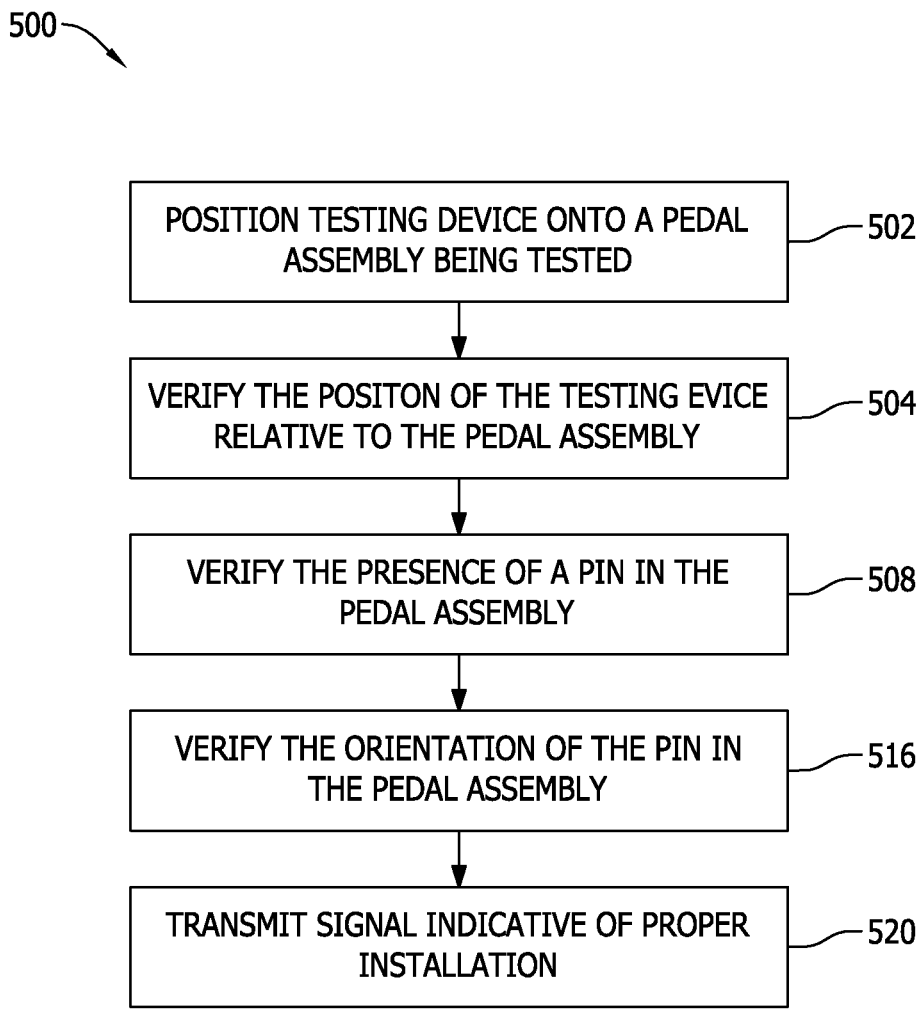
FIG. 5 is a flow diagram of an exemplary method of verifying installation of a pedal assembly using the testing device shown in FIGS. 2-4.

FIG. 5 is a flow diagram of an exemplary method 500 of verifying installation of a pedal assembly, such as pedal assembly 100, using testing device 200. During a testing procedure of a pedal assembly, using handle 204, an operator positions 502 testing device 200 onto a pedal assembly to be tested. As the testing device 200 is positioned 502 on the pedal assembly, the detent surfaces 210 are each received in a respective opening defined on the pedal assembly.

After testing device 200 has been positioned relative to the pedal assembly 100, proximity sensors 260 and 290 verify 504 the position of device 200 relative to the pedal assembly 100. If the testing device 200 is positioned correctly, i.e., each detent surface 210 is received within a respective opening defined on the pedal assembly, then testing device 200 is verified 504 as being in the proper position to perform the installation testing on the pedal assembly 100. As described above, proximity sensors 260 and 290 cause a signal to be transmitted to the PLC if each detent surface 210 is properly positioned within each respective opening defined on the pedal assembly 100. After the testing device 200 is verified 504 as being in the proper position relative to the pedal assembly, the operator may depresses activation button 296 to initiate the testing procedure. If the PLC determines the testing device is not verified 504 as being in the proper position, the testing procedure is ended until the device 200 is properly positioned.

After device 200 is verified 504 as being in the proper position, actuation button is depressed and telescoping cylinder 270 is activated and moved downwardly to the location where an upper end of a cotter pin 112 should be if pin 112 was installed correctly in the pedal assembly. Moving cylinder 270 positions sensor 274 in position against a cotter pin 112, and sensors 254 and 274 cooperate to initially verify 508 the presence of a cotter pin 112 installed in the pedal assembly 100. If a pin 112 is not detected, the testing procedure will not continue. If a pin is detected 508, sensors 254 and 274 verify 516 the orientation of the cotter pin 112 relative to the pedal assembly, i.e., is the pin 112 installed in proper orientation or is the pin 112 installed 90° from the correct installation orientation.

Moreover, during verification 516, sensors 254 and 274 also determine whether the pin 112 is installed upside down in the pedal assembly 100. More specifically, as telescoping cylinder 270 is moved downwardly, sensor 274 contacts pin 112, causing movement of cylinder 270 to stop. If cotter pin 112 is installed correctly, i.e., is not installed upside-down, the pin 112 will be pressed between sensors 254 and 274 and the orientation of cotter pin 112 will be verified 516. In contrast, if a pin 112 is installed in pedal assembly 100 in an inverted orientation, as telescoping cylinder 270 is moved downwardly, sensor 274 will contact pin 112, stopping movement of cylinder 270. However, because of the inverted orientation of pin 112, lower sensor 254 will not contact pin 112, and device 200 will not verify 516 the correct installation of cotter pin 112 in pedal assembly 100. As such, the combination of sensors 254 and 274 verify the installation of the cotter pin 112 within the pedal assembly 100 as device 200 will not verify the correct installation of the cotter pin 112 if the pin 112 is installed upside down or is installed at the wrong installation rotational orientation. Only after the pin 112 is verified 516 as being in the proper orientation, a signal is transmitted 520 to the PLC indicating a proper installation of the cotter pin within the pedal assembly being tested.

The above-described testing system uses a jig that is coupled within a testing device. The jig includes a plurality of sensors that enable an operator to easily determine if a cotter pin is properly installed in a pedal assembly in a cost-effective and reliable manner. Moreover, the testing device enables verifying the installation of a cotter pin in a pedal assembly in an easily repeatable and reliable manner. The testing device described herein is adaptable for use with pedal assemblies other than brake pedal assemblies, and with other equipment other than vehicles.

Exemplary embodiments of testing systems, and more specifically, testing devices are described above in detail. Although the testing devices are herein described and illustrated in association with a vehicle brake pedal assembly, the invention is also intended for use on other pedal assemblies. Moreover, it should also be noted that the components of the invention are not limited to the specific embodiments described herein, but rather, aspects of each component may be utilized independently and separately from other components and methods of assembly described herein.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method for verifying installation of a pedal assembly in a vehicle, said method comprising:
coupling a testing device against the pedal assembly being tested;
verifying a position of the testing device relative to the pedal assembly such that a first portion of the testing device is positioned against a first side of a pin installed in the pedal assembly;

verifying the installation of the pin within the pedal assembly;

positioning a second portion of the testing device against a second side of the pin; and verifying the installation of the pin within the pedal assembly.

2. The method of claim 1 wherein verifying the installation of the pin comprises transmitting a signal from at least one of a first sensor and a second sensor if the pin is installed correctly.

3. The method of claim 2 wherein transmitting a signal comprises transmitting a signal only if a circuit is completed between the first and second sensors by a correctly aligned pin in the pedal assembly.

4. The method of claim 1 wherein at least one of the first portion and the second portion of the testing device is positioned against the pin using a telescoping cylinder.

5. The method of claim 1 wherein coupling a testing device against the pedal assembly being tested further comprises inserting a plurality of detent surfaces on the testing device within openings defined in the pedal assembly.

6. The method of claim 5 wherein positioning a first portion of the testing device against a first side of a pin further comprises positioning a portion of the testing device against the first side to verify if the pin is installed in the correct position relative to the pedal assembly.

7. An apparatus for verifying installation of a pedal assembly in a vehicle, said apparatus configured to couple to the pedal assembly and comprising:
at least one sensor configured to verify a position of said apparatus relative to the pedal assembly being tested;
a first contact configured to verify installation of a pin in the pedal assembly; and
a second contact configured to verify alignment of the pin in the pedal assembly.

8. The apparatus of claim 7 wherein at least one of said first contact and said second contact are coupled to a telescoping cylinder.

9. The apparatus of claim 8 wherein said telescoping cylinder is configured to couple at least one of said first contact and said second contact to the pin.

10. The apparatus of claim 7 further comprising a detector coupled to said apparatus to detect correct alignment of the pin in the vehicle pedal assembly.

11. The apparatus of claim 10 wherein said first and said second contacts are electrically coupled to said detector such that, upon verifying correct alignment of the pin, a signal is transmitted to said detector to indicate the correct alignment of the pin.

12. The apparatus of claim 10 wherein said detector comprises a programmable logic controller (PLC).

13. The apparatus of claim 7 wherein said first contact is oriented such that said first contact will only verify installation of the pin upon contact with a first side of the pin.

14. The apparatus of claim 7 said second contact is oriented such that said second contact will only verify alignment of the pin upon contact with a second side of the pin.

15. A system for verifying installation of a pedal assembly in a vehicle, said system comprising:
a testing device configured to couple to the pedal assembly; and
at least one detector for verifying a position of the testing device relative to the pedal assembly being tested, said testing device comprising:
a handle oriented to enable said testing device to be positioned adjacent to the pedal assembly being tested; and
at least one sensor for verifying installation of a pin coupled within the pedal assembly.

16. The system of claim 15 wherein said testing device comprises at least one telescoping cylinder configured to selectively position said testing device against the pin coupled within the pedal assembly.

17. The system of claim 15 wherein said testing device at least one sensor comprises a first sensor and a second sensor, said first sensor oriented to verify installation of a pin within the pedal assembly, said second sensor is configured to verify correct alignment of the pin coupled within the pedal assembly.

18. The system of claim 17 wherein said first and second sensors are configured to electrically couple to the pin such that upon verifying the correct alignment of the pin, a signal is transmitted to indicate the correct alignment of the pin coupled within the pedal assembly.

19. The system of claim 17 wherein said testing device comprises a first surface feature oriented such that said first sensor will only verify correct alignment of the pin within the pedal assembly upon contact with a first side of the pin.

20. The system of claim 17 wherein said at least one detector murphy proofs said testing device such that said testing device only couples in one orientation relative to the pedal assembly being tested.

* * * * *